United States Patent
Yang et al.

(10) Patent No.: US 8,232,140 B2
(45) Date of Patent: Jul. 31, 2012

(54) METHOD FOR ULTRA THIN WAFER HANDLING AND PROCESSING

(75) Inventors: Ku-Feng Yang, Dali (TW); Weng-Jin Wu, Hsinchu (TW); Wen-Chih Chiou, Toufen (TW); Tsung-Ding Wang, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 166 days.

(21) Appl. No.: 12/731,281

(22) Filed: Mar. 25, 2010

(65) Prior Publication Data

US 2010/0244284 A1 Sep. 30, 2010

Related U.S. Application Data

(60) Provisional application No. 61/164,092, filed on Mar. 27, 2009.

(51) Int. Cl.
*H01L 21/00* (2006.01)

(52) U.S. Cl. ........ 438/109; 438/106; 438/107; 438/114; 257/E25.013; 257/686; 257/777; 361/760

(58) Field of Classification Search ........... 257/E21.502, 257/E23.116, E25.013, 685, 686, 723, 737, 257/777; 438/106–110, 112, 114, 124–127; 361/760
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,784,023 B2 * | 8/2004 | Ball | 438/113 |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |

(Continued)

*Primary Examiner* — Chris Chu

(74) *Attorney, Agent, or Firm* — Lowe Hauptman Ham & Berner, LLP

(57) ABSTRACT

A method for thin wafer handling and processing is provided. In one embodiment, the method comprises providing a wafer having a plurality of semiconductor chips, the wafer having a first side and a second side. A plurality of dies are attached to the first side of the wafer, at least one of the dies are bonded to at least one of the plurality of semiconductor chips. A wafer carrier is provided, wherein the wafer carrier is attached to the second side of the wafer. The first side of the wafer and the plurality of dies are encapsulated with a planar support layer. A first adhesion tape is attached to the planar support layer. The wafer carrier is then removed from the wafer and the wafer is diced into individual semiconductor packages.

15 Claims, 6 Drawing Sheets

U.S. PATENT DOCUMENTS

| | | | |
|---|---|---|---|
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,087,502 B2 * | 8/2006 | Priewasser et al. | 438/464 |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,217,595 B2 * | 5/2007 | Morrow et al. | 438/108 |
| 7,262,495 B2 | 8/2007 | Chen et al. | |
| 7,295,029 B2 * | 11/2007 | Zhao | 438/110 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,372,140 B2 * | 5/2008 | Lee | 257/686 |
| 7,416,919 B2 * | 8/2008 | Chou | 438/107 |
| 7,508,059 B2 * | 3/2009 | Lin et al. | 257/686 |
| 7,662,666 B2 * | 2/2010 | Kondo | 438/109 |
| 7,807,505 B2 * | 10/2010 | Farnworth et al. | 438/113 |
| 7,863,092 B1 * | 1/2011 | Chaware et al. | 438/106 |
| 7,883,991 B1 * | 2/2011 | Wu et al. | 438/459 |
| 7,994,026 B2 * | 8/2011 | Harikai et al. | 438/464 |
| 8,017,439 B2 * | 9/2011 | Takahashi et al. | 438/109 |

* cited by examiner

METHOD FOR ULTRA THIN WAFER HANDLING AND PROCESSING

CROSS-REFERENCE TO RELATED APPLICATIONS

The present application claims priority of U.S. Provisional Patent Application Ser. No. 61/164,092, filed on Mar. 27, 2009, which is incorporated herein by reference in its entirety.

BACKGROUND

The present invention relates generally to wafer handling and processing, and more particularly to a method for ultra thin wafer handling and processing.

In the semiconductor industry, efforts to reduce the thickness of a semiconductor wafer are in progress to respond to the goals of reducing the thickness of semiconductor packages, to increase the chip speed, and for enabling high-density fabrication. However, with thinned dimensions, these ultra thin wafers are too fragile to reliably handle or manipulate during process steps, such as dicing the wafer into individual chip packages. They have insufficient strength and are more susceptible to cracking and deformation, such as bending and/or warping. One way of handling the ultra thin wafer is to encapsulate it in a molding compound, such as thermocuring epoxy resin.

However, encapsulating an ultra thin wafer in a molding compound during handling and processing is not without its drawbacks. Where the molding compound has become undone or delaminated from the wafer to which it is attached to, the wafer may be subject to warpage. Wafer warpage is detrimental to the fabrication process and tends to decrease the overall process yield and may degrade the quality and reliability of the chip packages that are produced. Moreover, where molding delamination from the wafer has occurred, the edges of the wafer may be more susceptible to cracking, chipping, and/or corrosive environmental influences during the subsequent dicing process and associated handling. In stacked chips, heat becomes an issue. Molding compounds generally accumulate an excessive amount of heat, which then impacts device performance.

For these reasons and other reasons that will become apparent upon reading the following detailed description, there is a need for an improved method of handling and processing ultra thin wafers that avoids the shortcomings of conventional methods.

BRIEF DESCRIPTION OF THE DRAWINGS

The features, aspects, and advantages of the present invention will become more fully apparent from the following detailed description, appended claims, and accompanying drawings in which:

FIGS. 1A-6A are cross-sectional views depicting a semiconductor device undergoing various stages of fabrication according to one embodiment of the present invention.

FIGS. 1B-6B are cross-sectional views depicting a semiconductor device undergoing various fabrication stages according to another embodiment of the present invention.

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
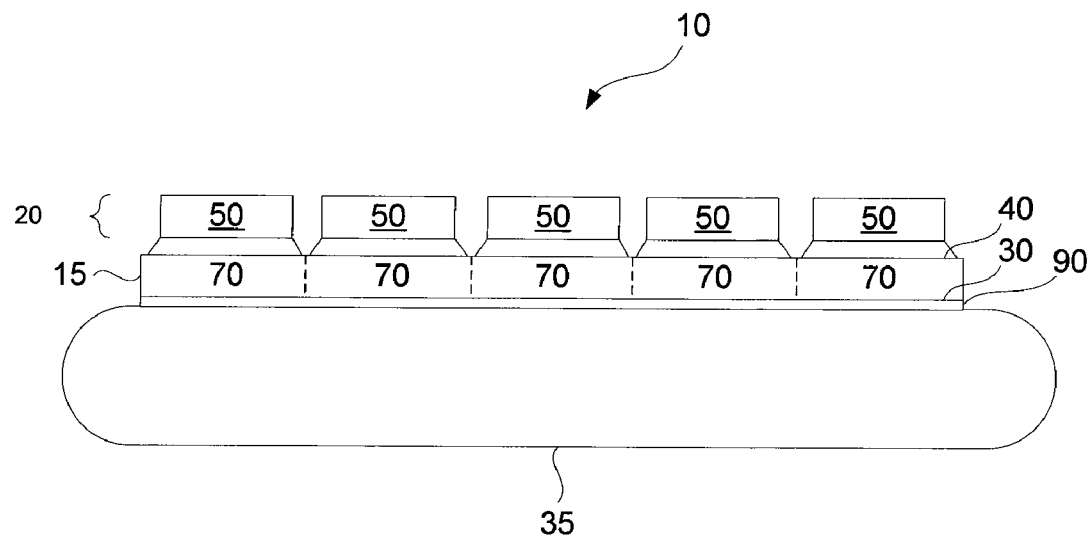

FIGS. 1A-6A are cross-sectional views depicting a semiconductor device undergoing various stages of fabrication according to one embodiment of the present invention. FIG. 1A shows a cross-sectional view of an integrated circuit structure 10. Integrated circuit structure 10 includes a wafer 15 having a plurality of semiconductor chips 70. Wafer 15 has a front surface 30 and a back surface 40, wherein bond pads (not shown) and/or other interconnect structures (not shown) are close to the front surface 30, while one or more through-silicon-vias (TSVs) (not shown) extend to the back surface 40. Redistribution layers (RDLs) (not shown) may be formed on the back surface 40 before bond pads are formed for die attachment. Integrated circuits (not shown) including active and passive devices such as transistors, resistors, capacitors, and the like, are formed at the front surface 30 of wafer 15.

Wafer 15 includes semiconductor wafers such as silicon, gallium arsenide, a rock crystal wafer, sapphire, glass, and the like. Semiconductor chips 70 may include memory chips, RF (radio frequency) chips, logic chips, or other chips. Dies 20 are bonded to the back surface 40 of wafer 15. Dies 20 may include memory chips, RF chips, logic chips, or other chips. Each of the dies 20 includes semiconductor substrate 50. At least one of dies 20 is bonded to at least one of the plurality of semiconductor chips 70. So, for example, one die 20 may be bonded to two or more chips 70. Alternatively, one semiconductor chip 70 may have more than one die 20 bonded thereon. The dies 20 bonded onto a same semiconductor chip 70 may have the same or different circuit design and/or sizes.

Preferably, dies 20 and chips 70 are bonded fact-to-back, wherein the bonding methods include commonly used methods such as die bonding, solder bumping, oxide-to-oxide bonding, oxide-to-silicon bonding, copper-to-copper bonding, adhesive bonding, fusion bonding via oxide-to-oxide bond, bonding by a glue medium such as benzocyclobutene (BCB), and the like. One or more through-silicon vias (TSVs) (not shown) may extend from wafer 15 to dies 20 to make electrical connection therebetween.

Also shown in FIG. 1A is a wafer carrier 35 attached to the front surface 30 of wafer 15 by an adhesive layer 90. Wafer carrier 35 acts as a temporary support substrate or carrier to facilitate wafer handling, transport, and processing. Wafer carrier 35 can be a silicon substrate, glass substrate, polymer substrate, polymer-based composite substrate, or thick tape and may be attached to the front surface 30 of wafer 15 by, for example adhesive bonding, tape bonding, or resin bonding. Wafer carrier 35 is preferably rigid as a rigid carrier helps to reduce wafer warping and prevents wafer breakage during handling and processing.

Figure 2A:
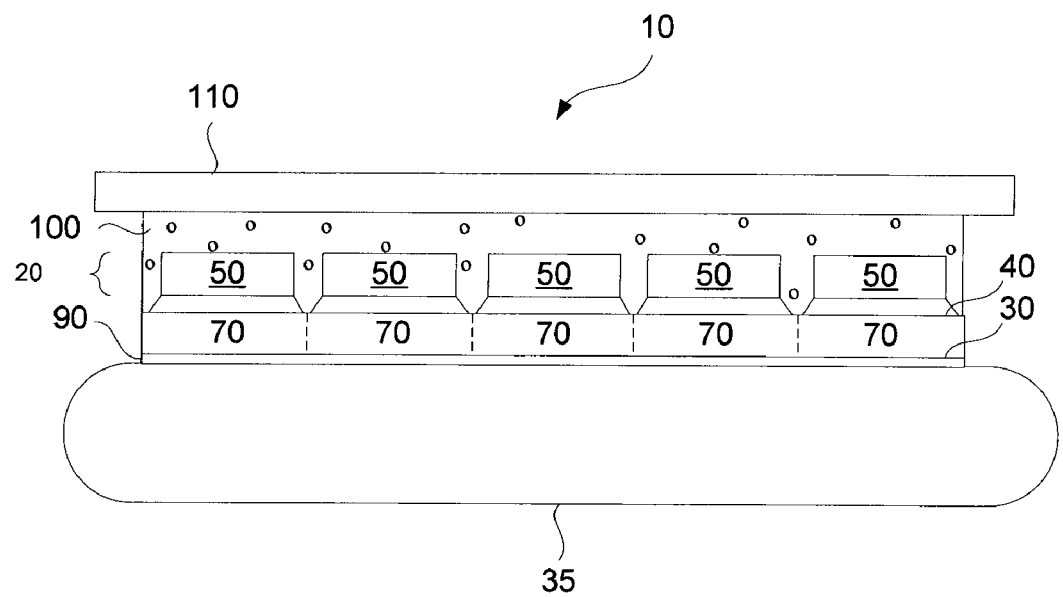

FIG. 2A shows integrated circuit structure 10 undergoing a further process step where a support layer 100 is coated over the back surface 40 of wafer 15 and over the plurality of dies 20 to encapsulate the back surface 40 of wafer 15 and the dies 20. Support layer 100 supports the wafer during handling or during a process step, such as wafer dicing and maybe removed following the process step. Support layer 100 may be formed of a material such as, for example PEG (polyethylene glycol), wax, polymer, or a polymer-based material, or a combination thereof. In one embodiment, the support layer 100 is a polymer having a molecular weight of 1500 and a melting temperature of more than 45° C. Support layer 100 may be applied to integrated circuit structure 10 by conventional methods such as spin coating, printing, or future-developed processes and preferably achieves a planar top surface. Support layer 100 may be formed on wafer 15 to a thickness greater than the height of dies 20 so as to encapsulate dies 20. A conventional CMP (chemical mechanical planarization) process may optionally be performed on integrated circuit structure 10 to planarize the top surface of support layer 100 and/or polish the support layer 100 to a desired thickness.

Figure 3A:
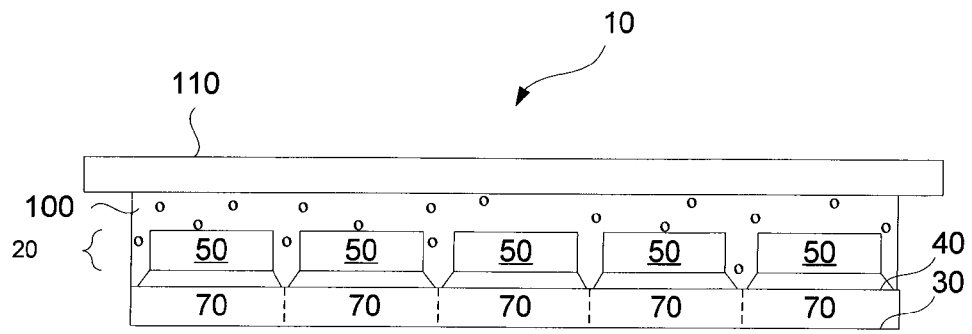
Figure 4A:
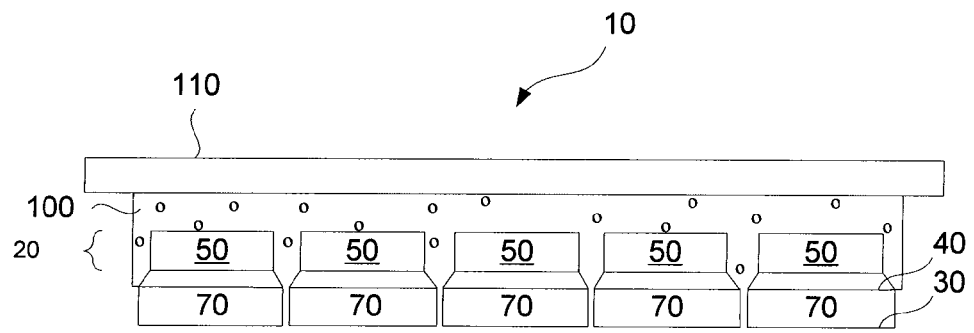
Figure 5A:
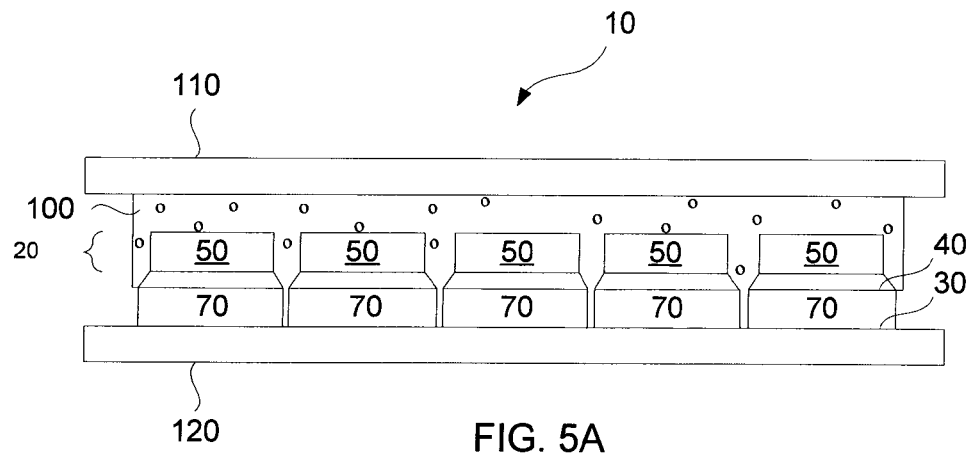
Figure 3B:
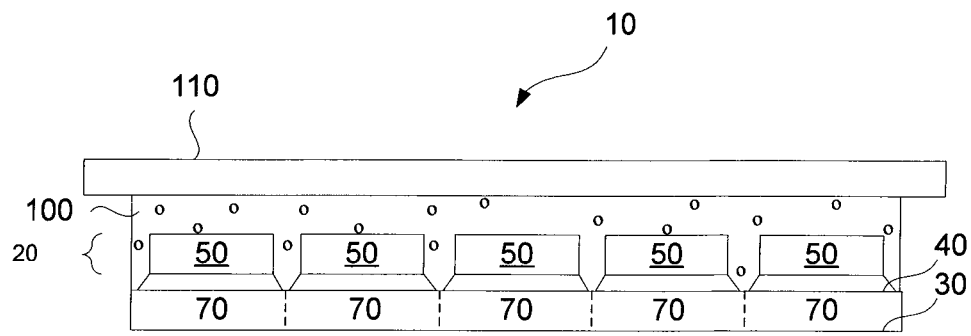
Figure 4B:
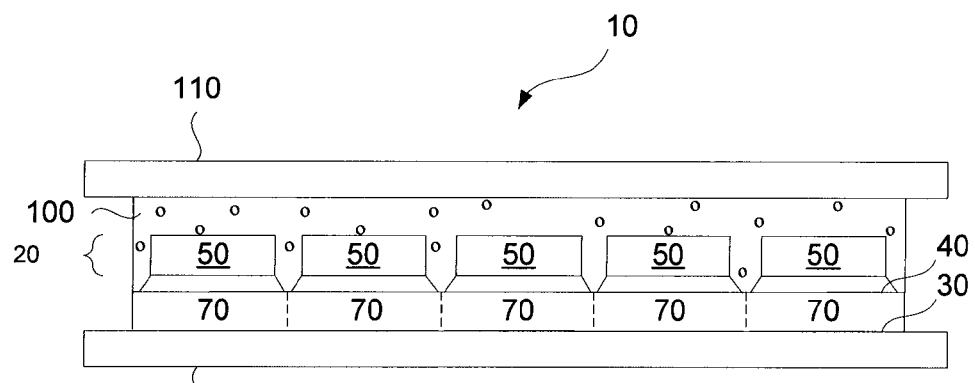
Figure 5B:
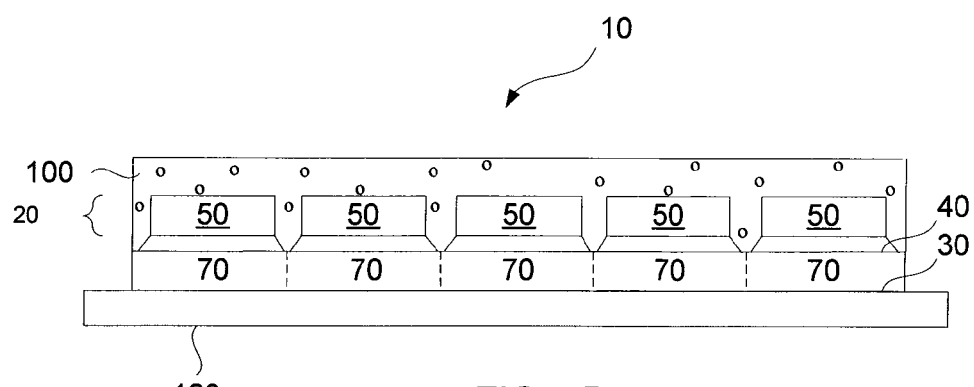
Figure 6A:
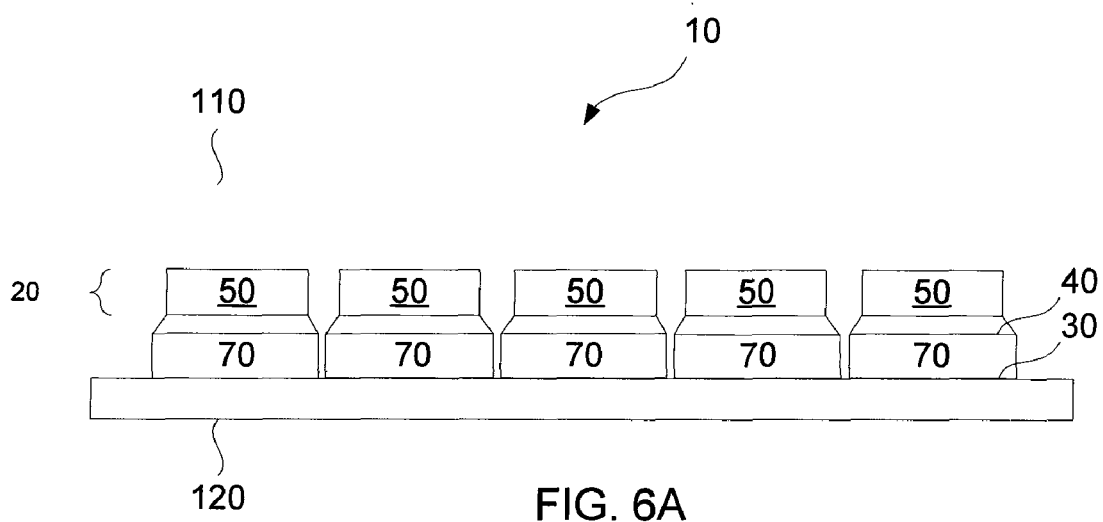

Following the formation of the planarized support layer 100, a first adhesion tape 110 is affixed to the support layer 100. The adhesion tape 110 may be a dicing tape or an ultraviolet tape. Following removal of the wafer carrier 35 as shown in FIG. 3A, in FIG. 4A, with the integrated circuit structure 10 affixed to the adhesion tape 110, wafer 15 undergoes a conventional dicing process to separate the wafer 15 into individual parts. In order to remove the separated individual parts for later packaging as individual semiconductor packages, the support layer 100 and the adhesion tape 110 will need to be removed. FIG. 5A shows a second adhesion tape 120 attached to the second side 30 of wafer 15. The second adhesion tape 120 may include a dicing tape or an ultraviolet tape. The first adhesion tape 110 and the support layer 100 are thereafter removed as shown in FIG. 6A. Support layer 100 may be removed by applying heat to the support layer 100 in excess of its melting temperature and the melted support layer 100 may be removed away in a spinning tool or wet batch tool, for example. Where the support layer 100 is formed by PEG, for example, heating the support layer 100 to a temperature of 45° C. or greater melts the support layer 100. The heating apparatus may include heating plates and heating lamps. Following the removal of the second adhesion tape 120, the separated individual parts can then be packaged as individual semiconductor packages for bonding to a substrate such as a printed circuit board (PCB).

Figure 1B:
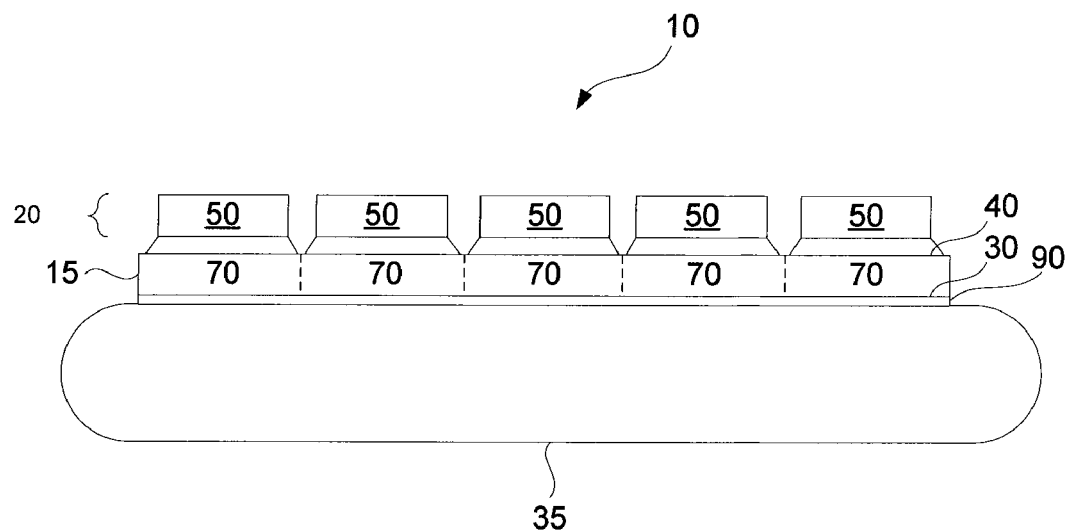
Figure 2B:
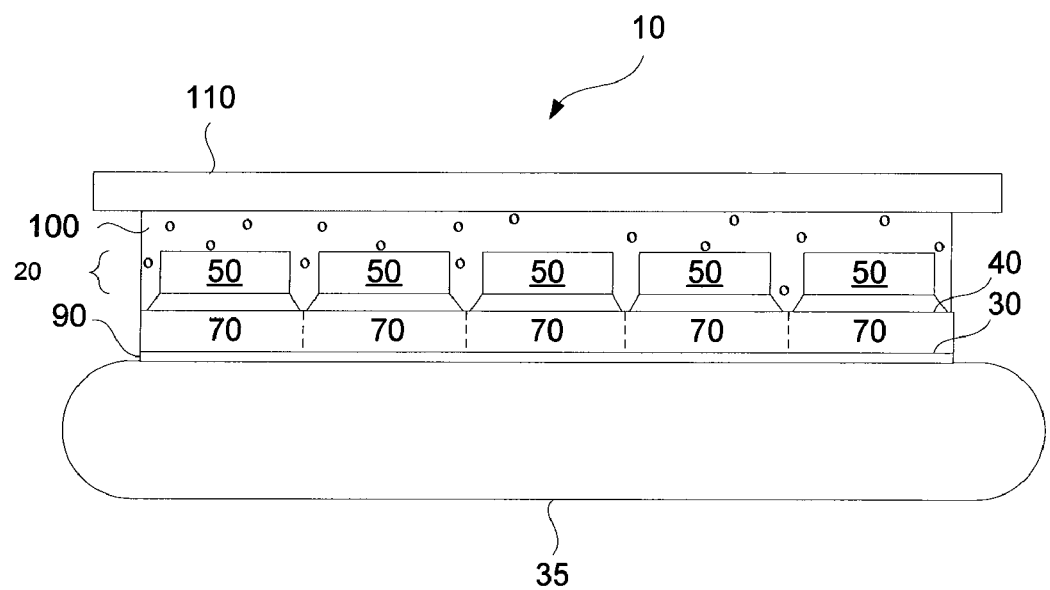
Figure 6B:
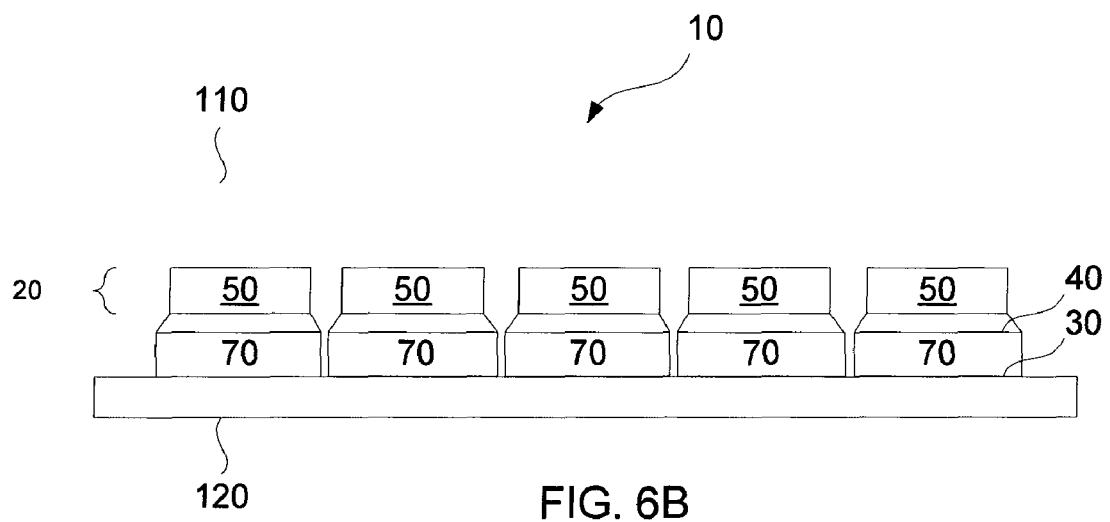

FIGS. 1B-6B are cross-sectional views depicting a semiconductor device undergoing various fabrication stages according to another embodiment of the present invention. The steps shown in FIGS. 1B, 2B, and 3B are the same as described above with respects to FIGS. 1A, 2A, and 3A and therefore will not be described again. In FIG. 4B, a second adhesion tape 120 is attached to the second side 30 of wafer 15 following the removal of the wafer carrier 35. The second adhesion tape 120 may include a dicing tape or an ultraviolet tape. FIG. 5B shows the removal of the first adhesion tape 110. The support layer 100 is removed and then wafer 15 is then diced in the usual manner to separate the wafer into individual parts, as shown in FIG. 6B. Support layer 100 may be removed by applying heat thereto in excess of its melting temperature and the melted support layer 100 may be removed away in a spinning tool or wet batch tool. Following the removal of the second adhesion tape 120, the separated individual parts can then be packaged as individual semiconductor packages for bonding to a substrate such as a printed circuit board (PCB).

Embodiments of the above methods for ultra thin wafer handling and processing have been described that yields high wafer throughput with low wafer breakage rate as compared to other prior art methods.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for thin wafer handling and processing, comprising:
providing a wafer having a plurality of semiconductor chips, the wafer having a first side and a second side;
attaching a plurality of dies to the first side of the wafer, wherein at least one of the dies bonded to at least one of the plurality of semiconductor chips;
providing a wafer carrier, wherein the wafer carrier is attached to the second side of the wafer;
encapsulating the first side of the wafer and the plurality of dies with a planar support layer; and
attaching a first adhesion tape to the planar support layer.

2. The method of claim 1, wherein the wafer carrier comprises a silicon substrate, glass substrate, polymer substrate, polymer-based composite substrate, or thick tape.

3. The method of claim 1, wherein the wafer carrier is attached to the second side of the wafer by a method selected from the group consisting of adhesive bonding, tape bonding, and resin bonding.

4. The method of claim 1, wherein attaching a plurality of dies to the first side of the wafer is performed by a method selected from the group consisting of die bonding, solder bumping, oxide-to-oxide bonding, oxide-to-silicon bonding, copper-to-copper bonding, adhesive bonding, fusion bonding via oxide-to-oxide bonding, and bonding by a glue medium such as benzocyclobutene (BCB).

5. The method of claim 1, wherein the support layer comprises PEG (polyethylene glycol), wax, polymer, or polymer-based material.

6. The method of claim 1, wherein encapsulating the first side of the wafer and the plurality of dies with the support layer comprises spin coating or printing.

7. The method of claim 1, wherein the first adhesion tape comprises a dicing tape or an ultraviolet tape.

8. The method of claim 1, further comprising removing the wafer carrier from the wafer and dicing the wafer into individual semiconductor packages.

9. The method of claim 8, further comprising attaching a second adhesion tape to the second side of the wafer, removing the first adhesion tape, removing the support layer, and removing the second adhesion tape.

10. The method of claim 9, wherein the second adhesion tape comprises a dicing tape or an ultraviolet tape.

11. A product for thin wafer handling and processing, the product made by the method of claim 8.

12. The method of claim 1, further comprising removing the wafer carrier from the wafer and attaching a second adhesion tape to the second side of the wafer.

13. The method of claim 12, wherein the second adhesion tape comprises a dicing tape or an ultraviolet tape.

14. The method of claim 12, further comprising removing the first adhesion tape, removing the support layer, and dicing the wafer into individual semiconductor packages.

15. A product for thin wafer handling and processing, the product made by the method of claim 14.

* * * * *